United States Patent
Chung et al.

(10) Patent No.: US 11,133,189 B2
(45) Date of Patent: Sep. 28, 2021

(54) METAL CUT PATTERNING AND ETCHING TO MINIMIZE INTERLAYER DIELECTRIC LAYER LOSS

(71) Applicant: International Business Machines Corporation, Armonk, NY (US)

(72) Inventors: Kisup Chung, Slingerlands, NY (US); Ekmini Anuja De Silva, Slingerlands, NY (US); Andrew Greene, Albany, NY (US); Siva Kanakasabapathy, Pleasanton, CA (US); Indira Seshadri, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 85 days.

(21) Appl. No.: 16/290,306

(22) Filed: Mar. 1, 2019

(65) Prior Publication Data

US 2019/0198327 A1    Jun. 27, 2019

Related U.S. Application Data

(62) Division of application No. 15/845,652, filed on Dec. 18, 2017, now Pat. No. 10,734,234.

(51) Int. Cl.
*H01L 21/28* (2006.01)
*H01L 29/51* (2006.01)

(52) U.S. Cl.
CPC .. *H01L 21/28247* (2013.01); *H01L 21/28158* (2013.01); *H01L 29/517* (2013.01)

(58) Field of Classification Search
CPC .......... H01L 21/28247; H01L 29/517; H01L 21/28158; H01L 21/823481; H01L 21/823437; H01L 29/66545
See application file for complete search history.

(56) References Cited

U.S. PATENT DOCUMENTS

| 5,869,135 | A | 2/1999 | Vaeth et al. |
| 7,838,370 | B2 | 11/2010 | Mehta et al. |
| 7,902,064 | B1 | 3/2011 | Chiang et al. |

(Continued)

OTHER PUBLICATIONS

List of IBM Patents or Applications Treated as Related.
(Continued)

*Primary Examiner* — Benjamin Tzu-Hung Liu
(74) *Attorney, Agent, or Firm* — Amin, Turocy & Watson, LLP

(57) ABSTRACT

The present disclosure relates to methods and apparatuses related to the deposition of a protective layer selective to an interlayer dielectric layer so that the protective layer is formed onto a top portion associated with the interlayer dielectric layer. In some embodiments, a method comprises: forming an interlayer dielectric layer on a substrate; covering a trench region with a metal liner, wherein the trench region is situated above the substrate and formed within the interlayer dielectric layer; and depositing a protective layer selective to the interlayer dielectric layer so that the protective layer is formed onto a top portion associated with the interlayer dielectric layer. In various embodiments, the depositing the protective layer comprises: repeatedly depositing the protective layer via a multi-deposition sequence; or depositing a self-assembled monolayer onto the top portion.

7 Claims, 23 Drawing Sheets

(56) References Cited

U.S. PATENT DOCUMENTS

| | | |
|---|---|---|
| 8,084,087 B2 | 12/2011 | Bent et al. |
| 8,404,582 B2 | 3/2013 | Horak et al. |
| 9,190,293 B2 | 11/2015 | Wang et al. |
| 9,299,575 B2 | 3/2016 | Park et al. |
| 9,449,871 B1* | 9/2016 | Bergendahl ....... H01L 21/76831 |
| 9,595,473 B2 | 3/2017 | Chen et al. |
| 9,741,558 B2 | 8/2017 | Chen et al. |
| 9,754,798 B1 | 9/2017 | Bi et al. |
| 2002/0173164 A1* | 11/2002 | Raffin ............... C23C 16/45574 438/761 |
| 2004/0238052 A1 | 12/2004 | Karp et al. |
| 2005/0088551 A1 | 4/2005 | Lee et al. |
| 2013/0113068 A1 | 5/2013 | Ramachandran et al. |
| 2015/0145027 A1 | 5/2015 | Lin et al. |
| 2015/0243747 A1 | 8/2015 | Kittl et al. |
| 2015/0325575 A1 | 11/2015 | Park et al. |
| 2015/0340461 A1 | 11/2015 | Wei et al. |
| 2016/0049310 A1 | 2/2016 | Kunnen et al. |
| 2016/0181399 A1 | 6/2016 | Jun et al. |
| 2016/0190009 A1* | 6/2016 | Wallace ............ H01L 21/76897 257/774 |
| 2017/0062421 A1 | 3/2017 | Cosemans et al. |
| 2017/0186746 A1 | 6/2017 | Chung et al. |

OTHER PUBLICATIONS

Non-Final Office Action received for U.S. Appl. No. 15/845,652 dated Jul. 9, 2019, 36 pages.

Gao et al., "Self-Assembled Monolayers of Alkylphosphonic Acids on Metal Oxides," Langmuir, 1996, pp. 6429-6435, vol. 12, No. 26, American Chemical Society, 7 pages.

Ting II et al., "Study on the Formation of Self-Assembled Monolayers on Sol-Gel Processed Hafnium Oxide as Dielectric Layers," Langmuir, 2009, pp. 2140-2147, vol. 25, No. 4, American Chemical Society, 8 pages.

Bao et al., "Additive Core Substitution Liner for Metal Cut Etch Processes," U.S. Appl. No. 15/459,539, filed Mar. 15, 2017.

Non-Final Office Action for U.S. Appl. No. 15/845,652 dated Aug. 27, 2018, 32 pages.

Final Office Action for U.S. Appl. No. 15/845,652 dated Jan. 11, 2019, 31 pages.

Final Office Action received for U.S. Appl. No. 15/845,652 dated Jan. 2, 2020, 34 pages.

\* cited by examiner

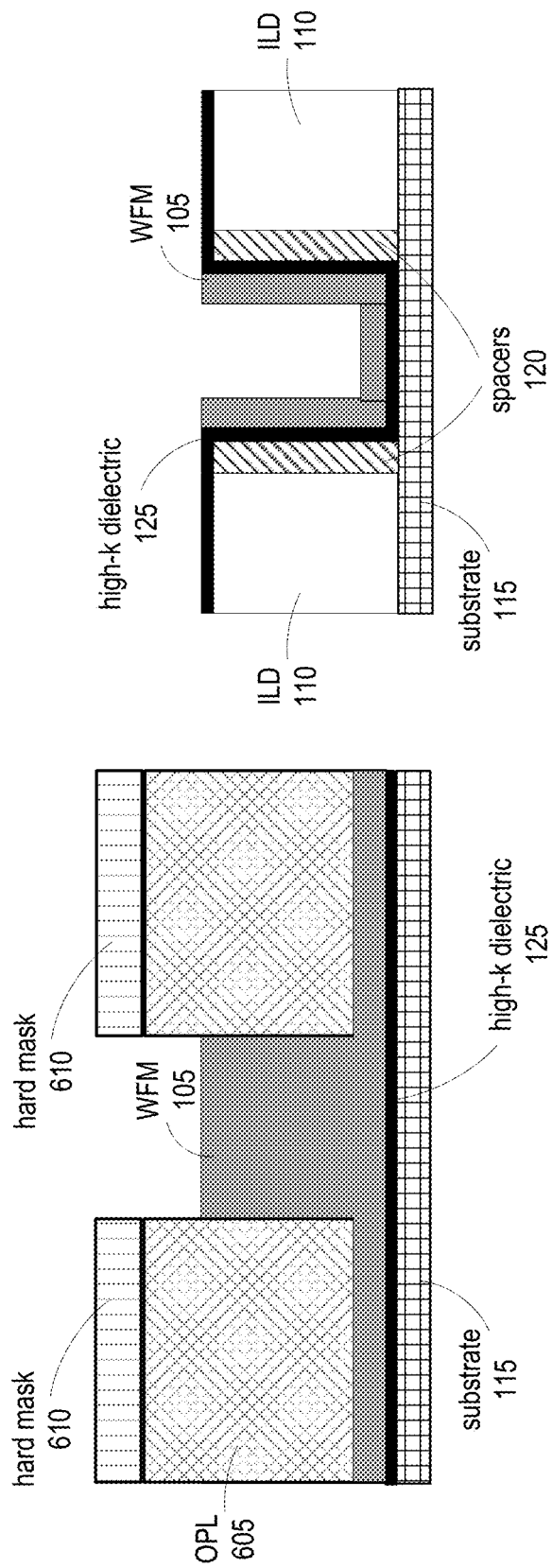

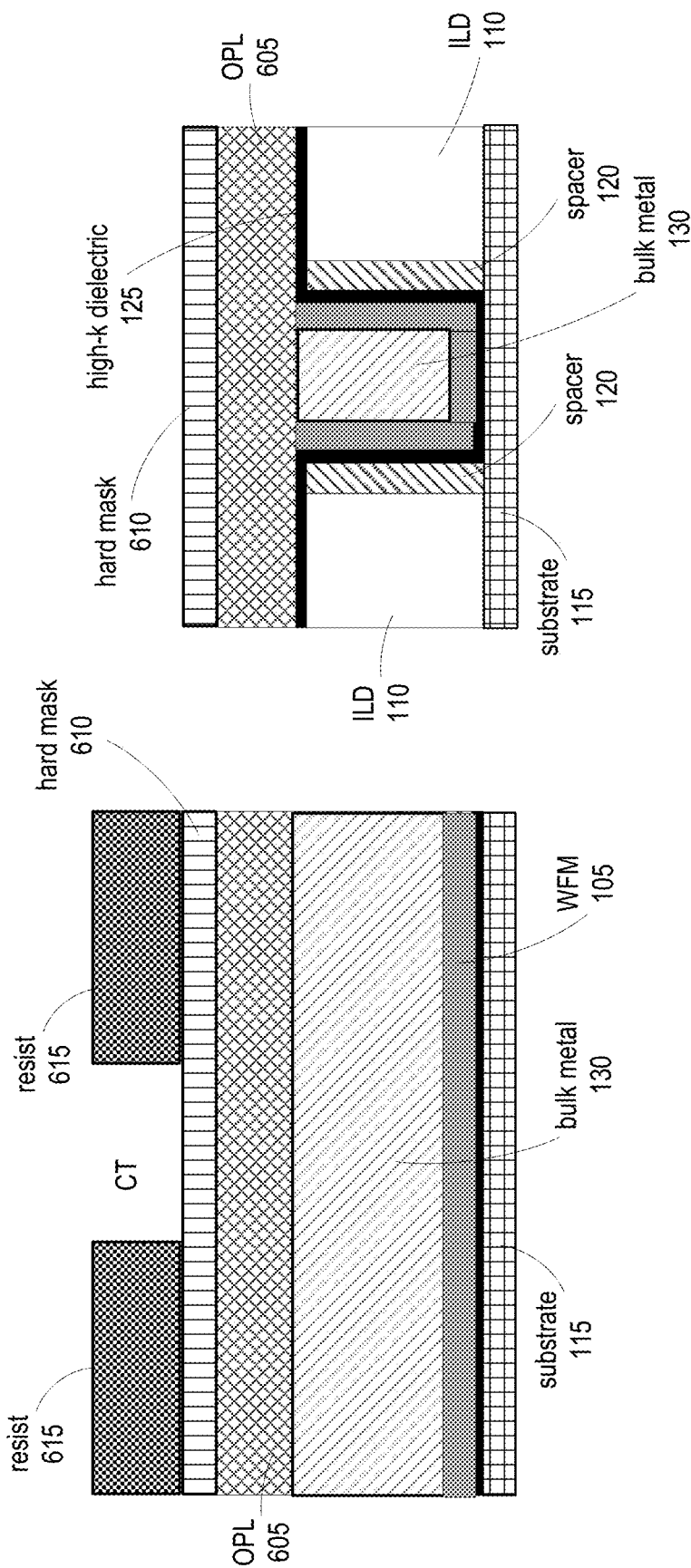

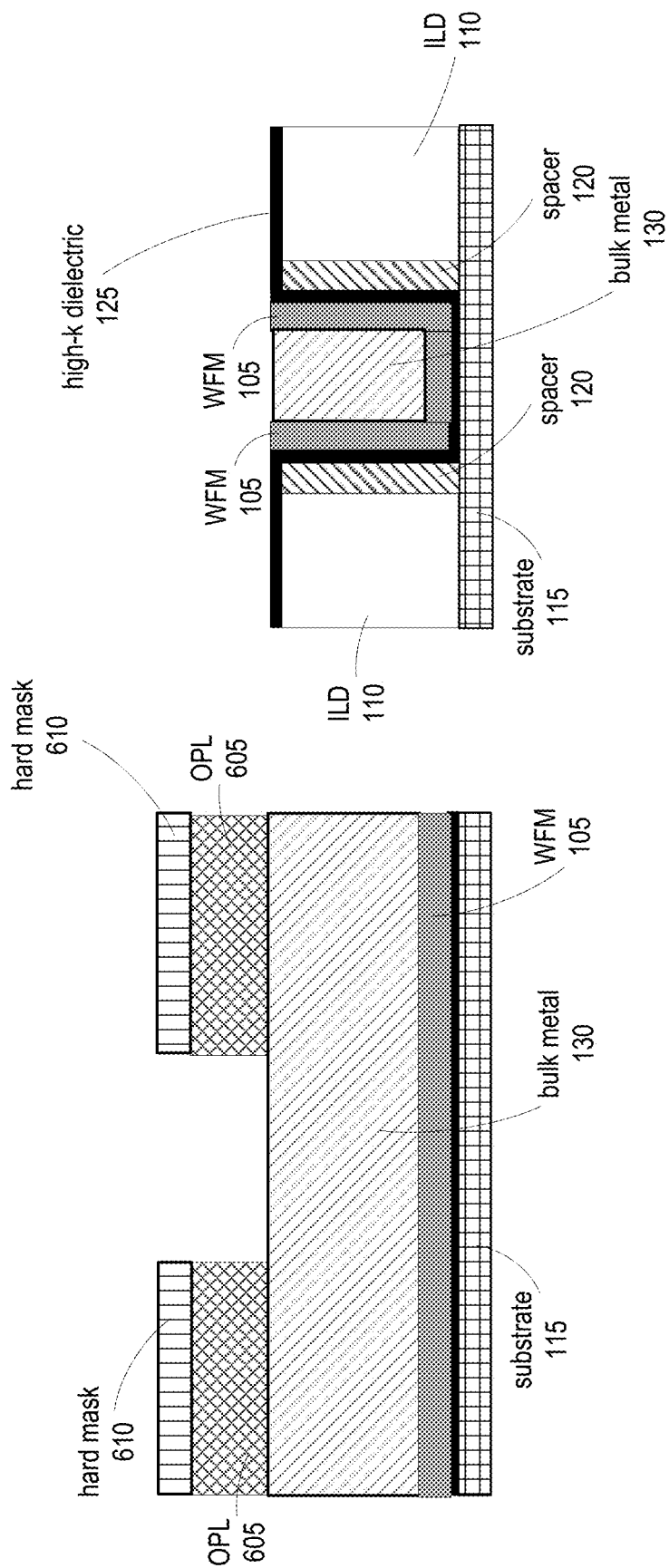

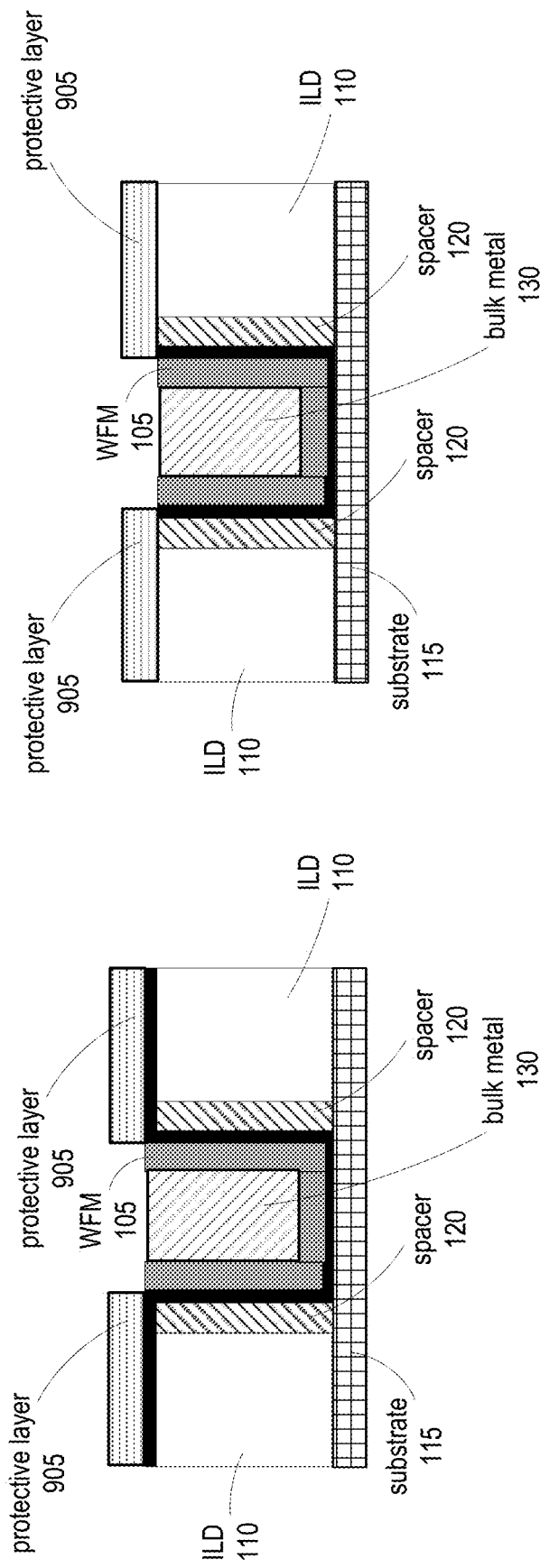

METAL CUT PATTERNING AND ETCHING TO MINIMIZE INTERLAYER DIELECTRIC LAYER LOSS

BACKGROUND

The subject disclosure relates to semiconductor device structures and assembly, and more specifically, to patterning, layering, and etching processes during assembly.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later.

According to example embodiments, a method is provided. The method can comprise forming an interlayer dielectric layer (ILD) on a substrate. The method at can comprise covering a trench region (e.g., gate region) with a metal liner (e.g., work function metal (WFM)), wherein the trench region is situated above the substrate and formed within the interlayer dielectric layer. The method can comprise depositing a protective layer selective to the interlayer dielectric layer so that the protective layer is formed onto a top portion associated with the interlayer dielectric layer. The protective layer can comprise an organic material, a polymer, or a dielectric. Methods mentioned below can be used for depositing the protective layer (e.g., selectively depositing the protective layer). For example, depositing the protective layer can comprise repeatedly depositing the protective layer via a multi-deposition sequence. The depositing the protective layer can comprise depositing a self-assembled monolayer onto the top portion. In other embodiments, the protective layer can be deposited on a high-k dielectric (e.g., high-k dielectric, e.g., hafnium dioxide (HfO2)) that covers the top portion. The method can further comprise removing the metal liner. The method can further comprise depositing the protective layer during the removing of the metal liner. The method can further comprise removing a metallic filler (e.g., bulk metal; e.g., tungsten) occupying a portion of the trench region (e.g., gate, gate region).

According to other example embodiments, a method is provided. The method can comprise forming an interlayer dielectric layer on a substrate. The method can comprise forming a first protective layer (e.g., a high-k dielectric; e.g., HfO2) that covers: a top portion associated with the interlayer dielectric layer, and covers the trench region (e.g., gate region). The method can comprise coating the first protective layer covering the trench region with a metal liner (e.g., work function metal (WFM)). The method can comprise depositing a second protective layer selective to the first protective layer so that the second protective layer is onto the first protective layer (e.g., high-k dielectric) covering the top portion. The depositing the second protective layer can comprise repeatedly depositing the second protective layer via a multi-deposition sequence. The depositing the second protective layer can comprise depositing a self-assembled monolayer onto the first protective layer. The method of can comprising removing the metal liner, and the depositing the second protective layer can occur during the removal of the metal liner. The method can further comprise removing a metallic filler occupying a portion of the trench region.

According to another example embodiment, a device is provided. The device can comprise an interlayer dielectric layer formed on a substrate. The device can comprise a first protective layer (e.g., high-k dielectric) that covers a top portion associated with the interlayer dielectric layer, and covers a trench region formed within the interlayer dielectric layer situated above the substrate. The device can comprise a metal liner (e.g., WFM) coating the first protective layer covering the trench region. The device can comprise a second protective layer that is selective to the first protective layer and deposited on the first protective layer (e.g., the high-k dielectric) covering the top portion. The second protective layer can comprise an organic material, a polymer, or a dielectric.

BRIEF DESCRIPTION OF THE DRAWINGS

FIG. 7A and FIG. 7B illustrate cross-sectional views of the structure, wherein a resist layer and organic planarizing layer (OPL) has been removed to form an anisotropic profile, in accordance with one or more embodiments described herein.

FIG. 15A and FIG. 15B illustrate cross-sectional views of the structure, illustrating patterning stack deposition in order to define a gate cut pattern, wherein the gate is filled with both the metal liner and the metallic filler, in accordance with one or more embodiments described herein.

FIG. 16A and FIG. 16B illustrate cross-sectional views of the structure, wherein CT patterning is used to create an anisotropic profile by etching a hard mask layer and the OPL (the resist layer can also be removed during the etch of the OPL), in accordance with one or more embodiments described herein.

FIG. 17A and FIG. 17B illustrate cross-sectional views of the structure in which a protective layer selective to the high-k dielectric, is deposited onto the high-k dielectric that covers the top portion of the ILD layer (FIG. 17A), and in which a protective layer selective to the ILD layer is deposited onto the ILD layer itself (FIG. 17B), in accordance with one or more embodiments described herein.

FIG. 18A and FIG. 18B illustrate cross-sectional views of the structure after the metallic filler (e.g., bulk metal) and metal liner (e.g., WFM) have been removed, and the ILD layer has been protected against recess or loss due to the protection layer covering it, in accordance with one or more embodiments described herein.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Figure 1:
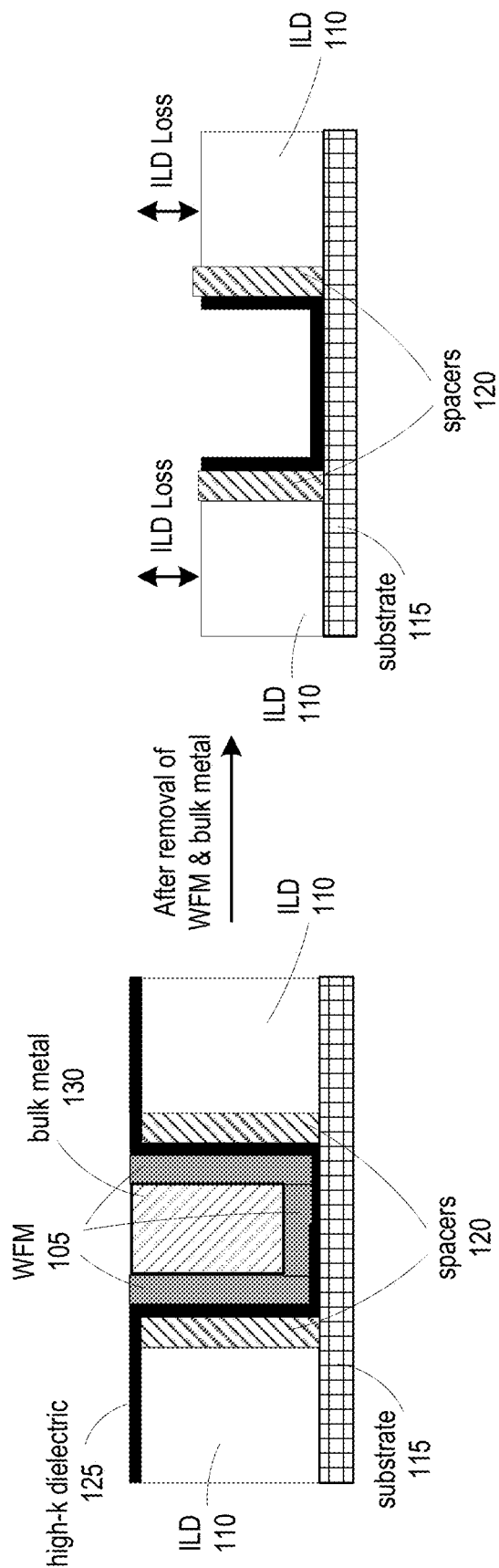
FIG. 1 illustrates a cross-sectional view of a continuous gate line of a semiconductor structure, wherein a metal liner (e.g., work function metal (WFM)) has been removed (e.g., etched) from a trench region (e.g., gate region) within an interlayer dielectric (ILD) layer, and the ILD has been recessed due to the removal.
Figure 2:
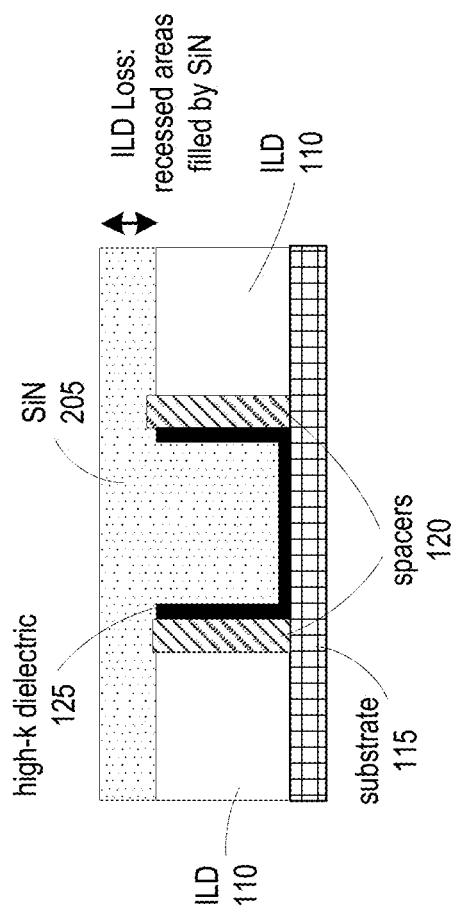
FIG. 2 illustrates a cross-sectional view of the structure, wherein a cut (CT) liner filler (e.g., silicon nitride (SiN)) has filled the trench region and the recessed regions of the ILD layer after removal of the metal liner.
Figure 3:
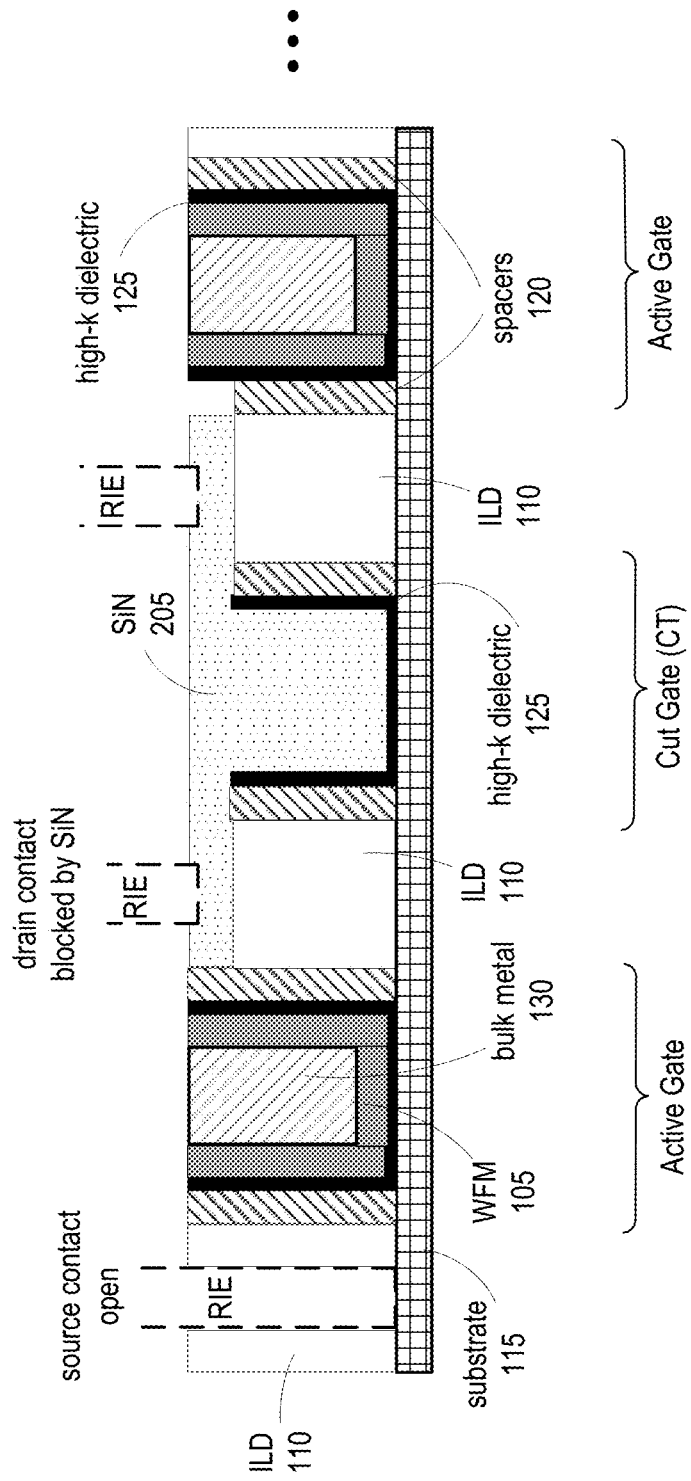
FIG. 3 illustrates a cross-sectional view of the structure, wherein etching to establish a source-drain interconnect through the ILD layer has been blocked by the CT liner filler, due to interlayer dielectric (ILD) layer recession from the metal liner etch.

With chip and dimensional scaling, gate cut (CT) patterning is being pushed closer and closer to the end fin. In some semiconductor device assembly processes, the cutting of the gates will take place during a replacement metal gate (RMG) process. In one stage of the process, vertical sidewalls are created so as to maintain gate cut dimensions. Typically, a metal liner, referred to as a work function metal (WFM), that lines the trench region within an interlayer dielectric (ILD) layer (also referred to by some as interlevel dielectric layer) is cut away to create vertical sidewalls. In some instances, the trench region contains both a WFM and a bulk metal (e.g., such as tungsten), both of which are etched away. However, during the process to etch away the metal liner, the etching process is not very selective as to ILD regions. Thus, during such a removal technique, when the metal liner (or, in other embodiments, both the metal liner, such as WFM, and a metallic filler, such as bulk metal) is etched away to create vertical sidewalls, a significant amount of the ILD might be etched away as well (e.g., leaving the ILD region recessed). The areas vacated by the cut away metal (e.g., metal liner, metallic filler) are typically filled with cut liner filler (e.g., CT liner filler), such as silicon nitride (SiN), or some other insulator. Additionally, any recessed ILD regions, which resulted from the etching away of the metal liner (and in some embodiments the metallic filler as well), could also be filled with silicon nitride. Efforts to pattern a source-drain contact by etching through the ILD to create a source-drain metal contact (e.g., by using a reactive ion etch (RIE) to cut through the ILD to reach the drain/substrate area) will effectively be stopped by this silicon nitride fill, the properties of which prevent etching through the ILD region to contact the active region (e.g., the active source-drain epitaxial growth). Thus, ILD loss during the removal of metal liner (and, in some embodiments, the removal of a both a metal liner and a metallic filler in the trench region) can prevent the creation of a source-drain interconnect through the ILD region that contacts the drain. FIGS. 1-3 illustrate this prevention.

Referring to FIG. 1, which illustrates a cross section cut of a continuous gate line, the cut shows a metal liner (e.g., WFM 105) residing in a trench region (e.g., gate region) formed within an interlevel dielectric layer (e.g., ILD layer 110 situated on a substrate 115. As mentioned above, the trench region might also be filled with a bulk metal 130, in addition to the metal liner. Spacers 120 can also define the trench region. A high-k dielectric layer 125 can line the trench region, and cover the top portion of the spacers and the top portion of the ILD layer 110. After the WFM 105 (and bulk metal 130 too, in some embodiments) is etched (e.g., using an anisotropic etching process, reactive ion etch (RIE), etc.), as shown in the right side of FIG. 1, the ILD layer 110 experiences recession (ILD loss), as the same process that etched away the WFM 105 also etched away portions of the ILD layer 110. ILD losses can be up to 50% of its original height/thickness, even with the high-k dielectric 125 coating.

Moving to FIG. 2, after removal the metal liner (e.g., WFM 105 and/or bulk metal 130), the trench region is filled with a cut liner filler (CT liner filler, e.g., SiN 205, or some other insulator). The SiN 205 would also fill any areas of the ILD 100 that became recessed due to the ILD loss resulting from the etching of the metal liner (e.g., WFM 105).

FIG. 3 shows another cross-sectional view, wherein the continuous gate line can have an active gate and cut gate (CT) areas where the gates will be cut. As shown in the left portion of FIG. 3, the ILD layer 110 can be etched through (e.g., using reactive ion etching RIE) all the way to the substrate 115 (e.g., "source contact open"). However, when attempts to etch through the ILD layer 110 regions that are recessed and subsequently filled with SiN 205, these attempts to create a drain contact are blocked, effectively stopped by the CT liner filler (e.g., silicon nitride filler/liner).

Figure 4:
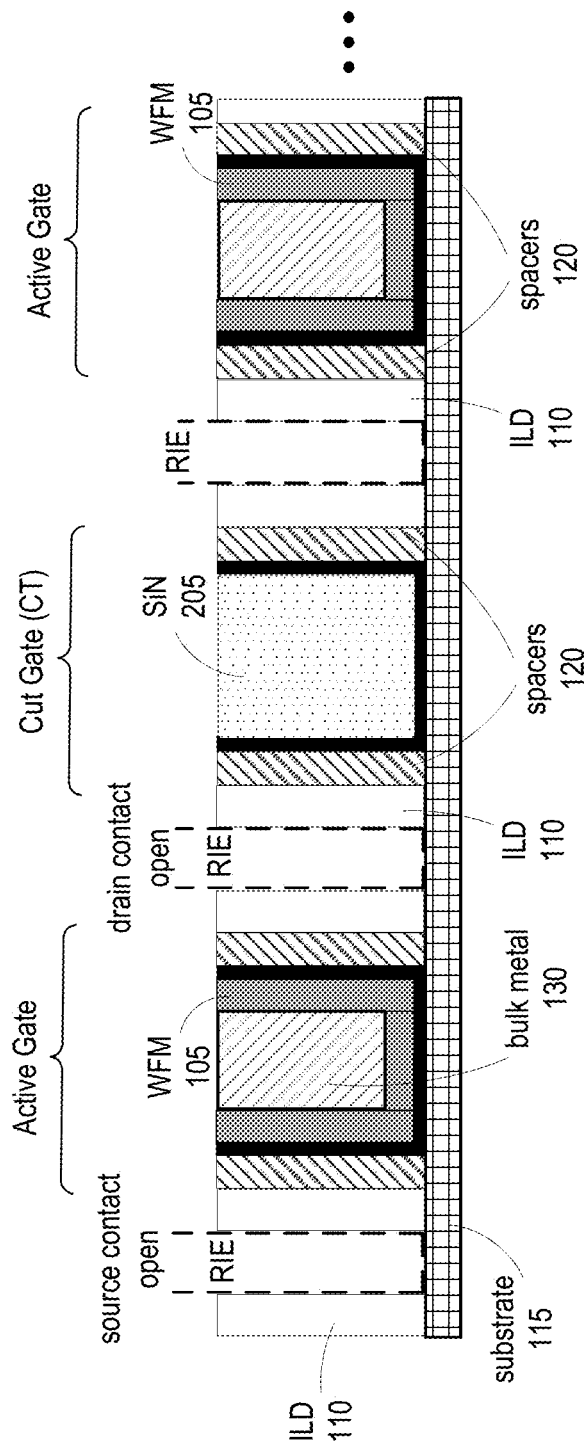
FIG. 4 illustrates a cross-sectional view of a semiconductor structure, wherein methods and apparatuses as described in the present application have preserved the ILD layer from recession that occurred during the removal of the metal liner (or in other embodiments, both the removal of the metal liner and a metallic filler), allowing for etching through the ILD layer to create a source-drain interconnect, in accordance with one or more embodiments described herein.

Moving to FIG. 4, the present application provides methods and an apparatus to preserve ILD from loss that occurs during the removal of the metal liner (e.g., WFM 105), or in other embodiments, the removal of both the metal liner (e.g., WFM 105) and the metallic filler (e.g., bulk metal 130). The methods and apparatus use a hard mask (e.g., titanium oxide (TiOx)) for patterning, and also selective deposition of a protective layer to minimize this ILD layer oxide loss and prevent blockage of source-drain contact etching. In example embodiments, a protective surface layer can be selectively deposited either on the ILD itself (e.g., ILD layer 110), or the high-k dielectric (e.g., high-k dielectric 125). The protective layer can be, for example, silicon dioxide (SiO2), silicon nitride (SiN), or hafnium dioxide (HfO2), etc., to prevent etching (or sputtering away) during the anisotropic metal etch. The material of the protective layer can be, in some example embodiments, the same material as the high-k dielectric. This selective deposition serves to prevent ILD erosion during metal liner etching. As shown in FIG. 4, when the ILD regions (e.g., ILD layer 110) have not experienced loss or erosion, there are no recessed ILD regions for the SiN 205 to fill. The SiN 205 fills the trench region from which the metal liner (or both the metal liner and a metallic filler in the trench region) was etched away, but the ILD regions are intact, and allow for the creation through etching of the source-drain interconnect (e.g., RIE through the ILD layer 110 all the way to the substrate).

Figure 5B:
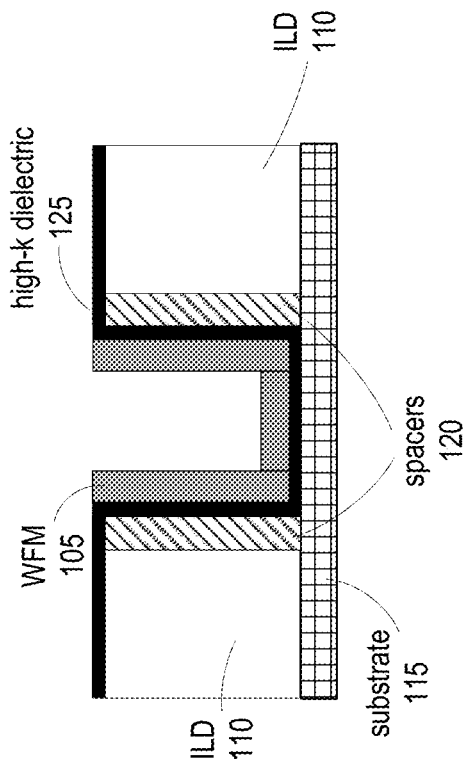
FIG. 5A and FIG. 5B illustrate cross-sectional views, of the incoming structure from which the semiconductor product will be patterned and cut, in accordance with one or more embodiments described herein.
Figure 5A:
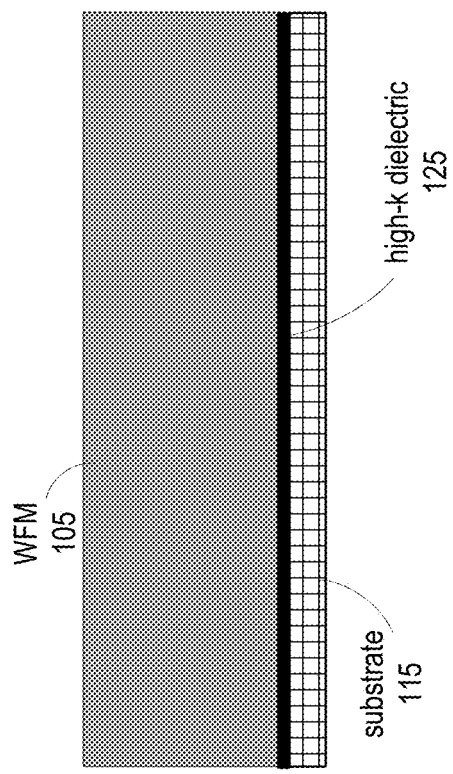
Figures 13A, 13B:
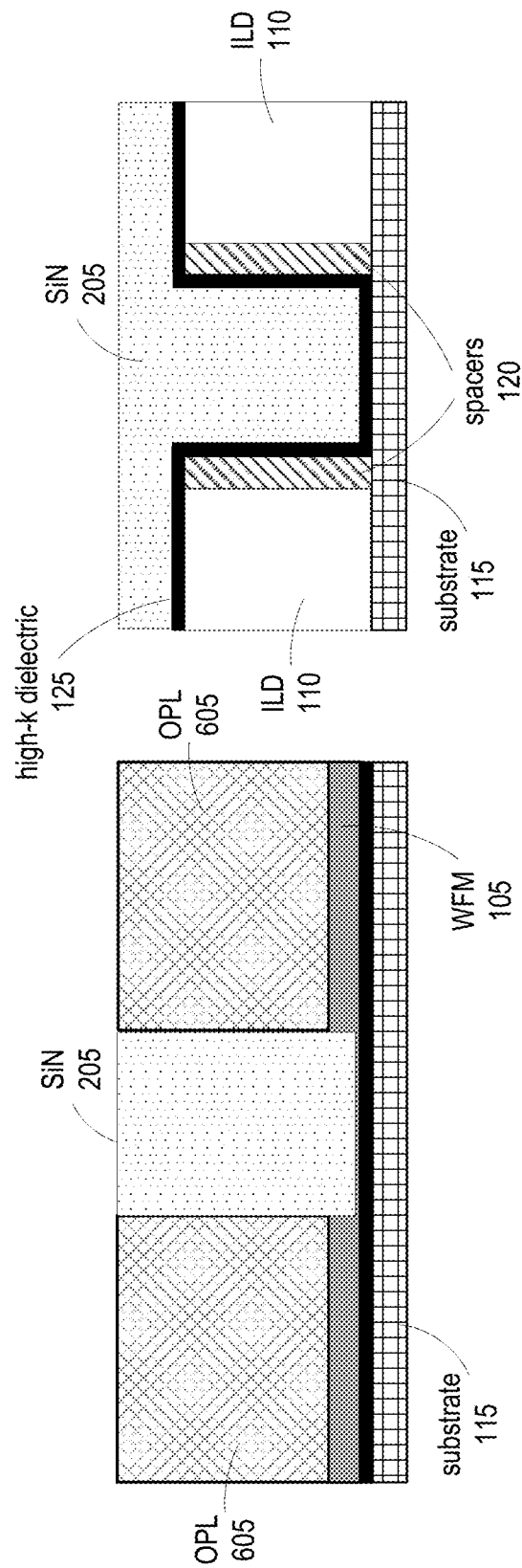
FIG. 13A and FIG. 13B illustrate cross-sectional views of the structure, in which the CT liner filler above the ILD layer is planarized, in accordance with one or more embodiments described herein.

FIG. 5A though FIG. 13B depict various example semiconductor gate assembly stages related to the methods and apparatuses, including hard mask patterning, the selective deposition of a protective layer protecting ILD layer and spacers, and the removal of a metal liner (e.g., WFM 105) from a trench region, in accordance with one or more embodiments described herein.

FIG. 5A presents a cross-sectional view illustrating the incoming structure from which the semiconductor product will be patterned and cut. Here, FIG. 5A shows a line of metal liner (e.g., work function metal) (with a cross-sectional view that is along the gate). In this cross section, the metal liner (e.g., WFM 105) is shown on top of a high-k dielectric material, which is situated above a substrate 115. FIG. 5B is also a cross-sectional view of the same incoming structure, wherein the view is a cross-sectional view across the gate. FIG. 5B shows an ILD layer 110 extending from the substrate 115, with spacers 120 adjacent to and in contact with each ILD layer 110. The trench formed in the middle (e.g., formed within the ILD layer 110) is lined with a high-k dielectric 125, and the metal liner (e.g., WFM 105) is situated along the walls and bottom of this trench region. The high-k dielectric deposited onto the top portions of the ILD layer 110 and spacers 120 during the formation of the replacement metal gate can be considered an attempt to preserve the ILD layer 110 during etching (e.g., anisotropic metal etching), and can be left on in order to provide additional protection against the etching.

Still referring to FIGS. 5A and 5B, materials wise, the substrate can be, for example, a silicon substrate. The substrate can further comprise a doped region (e.g., n-doped or p-doped region), which can, in some embodiments, serve as a drain. The drain can be formed sequentially on the substrate via epitaxial growth or can be doped in situ. Any suitable doping technique (e.g., ion implantation, plasma doping, etc.) can be used to form the drain. The high-k dielectric (e.g., high-k dielectric 125) can comprise materials that have a high dielectric constant k, wherein the constant k typically has a value over 3.9 for high-k dielectrics. Some examples of high-k dielectrics can be, for example hafnium dioxide (HfO2), zirconium dioxide (ZrO2) and titanium dioxide (TiO2). The ILD (e.g., ILD layer 110) can comprise any dielectric material including, for example, oxides, nitrides or oxynitrides. The metal liner (e.g., WFM 105) can comprise, for example, titanium nitride, aluminum, titanium, silver, copper, gold, or any combination thereof (e.g., an alloy), and can also comprise any metal seed liners (e.g., for back-end-of-line (BEOL) and middle of the line (MOL) applications). MOL applications can typically include titanium, titanium nitride (TiN), or a cobalt seed layer. Spacer 120 can comprise, for example, a dielectric material such as silicon oxide, silicon nitride, silicon oxynitride, a low-k material (e.g., amorphous carbon, fluorine-doped oxides, carbon-doped oxides, etc.) or any suitable combination of these materials.

Figures 6A, 6B:
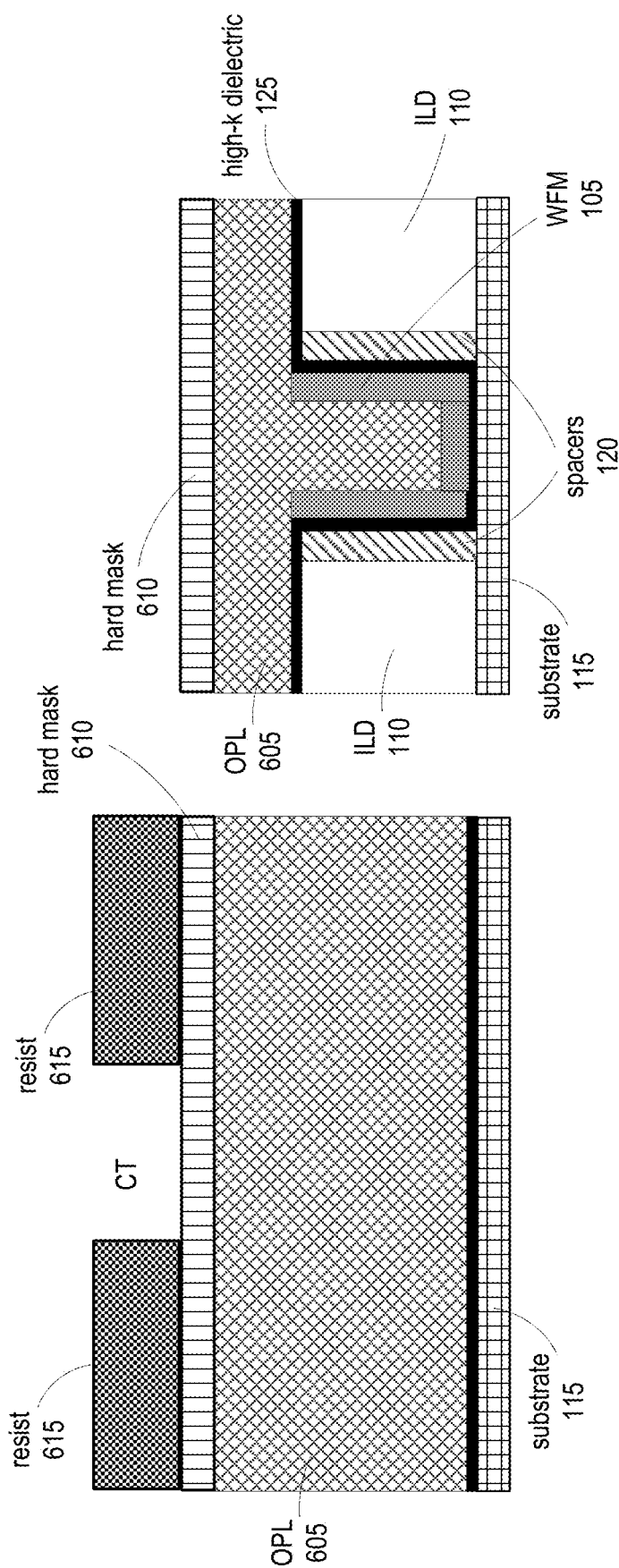
FIG. 6A and FIG. 6B illustrate cross-sectional views of the structure, illustrating patterning stack deposition in order to define a gate cut pattern, in accordance with one or more embodiments described herein.

FIGS. 6A and 6B present additional cross-sectional views illustrating patterning stack deposition in order to define a gate cut pattern. An organic planarization layer (OPL) 605 can be deposited (including deposited into the trench region defined by the sidewalls of the metal liner (e.g. WFM 105). The OPL deposition process can comprise baking at a temperature greater than CT liner filler material deposition temperatures. The OPL layer can be used for a patterning/etching process. A hard mask layer 610 can be deposited onto the OPL layer and used for patterning. The hard mask can be comprised of, for example, titanium oxide (TiOx), silicon nitride, silicon oxynitride, silicon oxide, etc. Titanium oxide, for example, can be stripped using wet removal or solvent removal techniques, and can be etched in similar dry etch chemistries as titanium, titanium nitride, and tungsten. After deposition of the hard mask layer 610, a resist layer 615 (e.g., a photoresist, photoresist mask) can be deposited. These patterning layers can be deposited by any suitable method depending on the type of material and can be, for example, chemical vapor deposition (CVD), atomic layer deposition (ALD), spin on and bake, etc. The resist is patterned on the structure using lithography (e.g., CT lithography) to form a desired pattern (e.g., the resist layer 615 can be developed to form a gate cut pattern), allowing the structure to be separated. Thus, the continuous gateline can be cut, using this CT pattern, into two separate gates. FIG. 6B is a cross section of where the cut is performed (e.g., CT in FIG. 6A), so the resist layer 615 is not shown in FIG. 6B.

FIG. 7A depicts a cross-sectional view of the assembly structure, wherein the photoresist has been removed. In the trench region, the OPL 605 has been etched away (e.g., using RIE) to form an anisotropic profile. The resist can be removed during the OPL RIE. In some example embodiments, the hard mask layer 610 can remain, and be removed when the metal liner (e.g., WFM 105) is removed (e.g., etched). Referring to FIG. 7B, another cross-sectional view across the gate, FIG. 7B does not show the OPL 605 because, in the location of FIG. 7A where the gate cut is performed, there is no OPL 605 that is present that can be viewed in 7B. In FIG. 7B, a cross section is shown where the OPL 605 has been etched down, opening up the trench region where the WFM 105 will eventually be etched away (and as such, based on the cut area, no OPL 605 is shown in FIG. 7B.

Figure 8B:
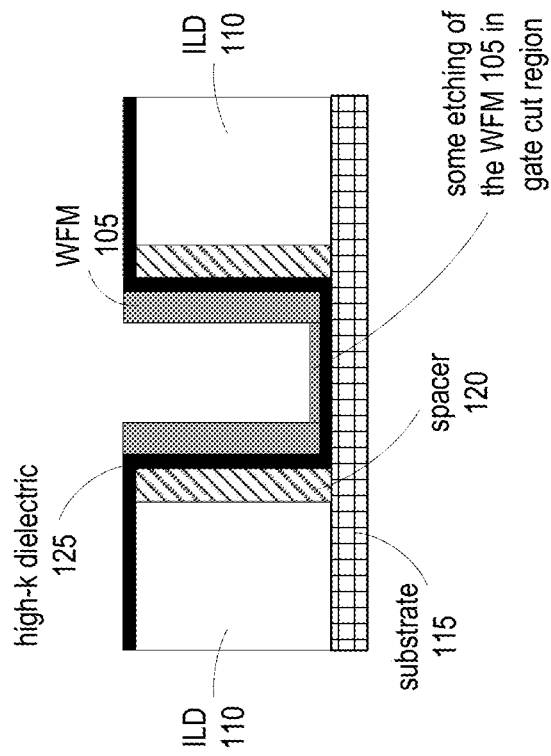
FIG. 8A and FIG. 8B illustrate cross-sectional views of the structure, that depict example embodiments wherein a layer of metal liner is on a high-k dielectric that covers a top portion of the ILD layer, in accordance with one or more embodiments described herein.
Figure 8A:
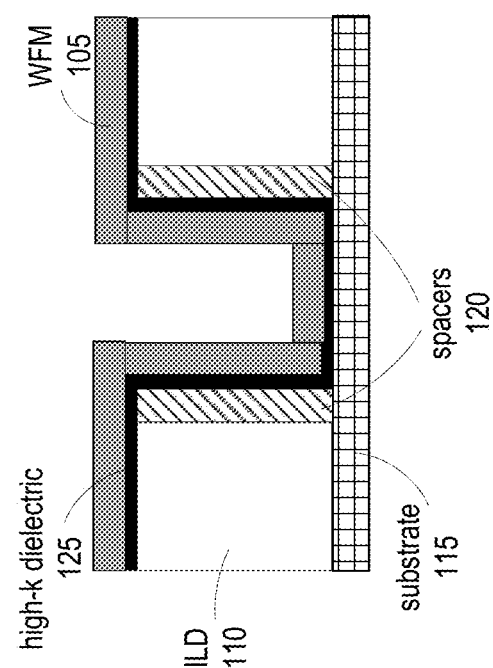

In other example embodiments, the cross-sections of which are shown in 8A (still in a stage in which the OPL 605 has been etched from the trench region), a layer of metal liner (e.g., WFM 105) is on the high-k dielectric 125 that is above the ILD layer 110 and the spacers 120. In these example embodiments, there can be an initial anisotropic etch of the metal liner during the removal of the hard mask (e.g., titanium oxide). The additional metal liner above the ILD layer 110 and spacers can provide some delay in exposing the high-k dielectric 125 on the ILD layer 110. In these example embodiments, as shown in FIG. 8B, the high-k dielectric might be etched away, but some amount of WFM 105 might also be etched. For example, this process can result in some etching of the metal liner (e.g., WFM 105) within the CT trench bottom region, as shown in FIG. 8B.

Figures 9A, 9B:
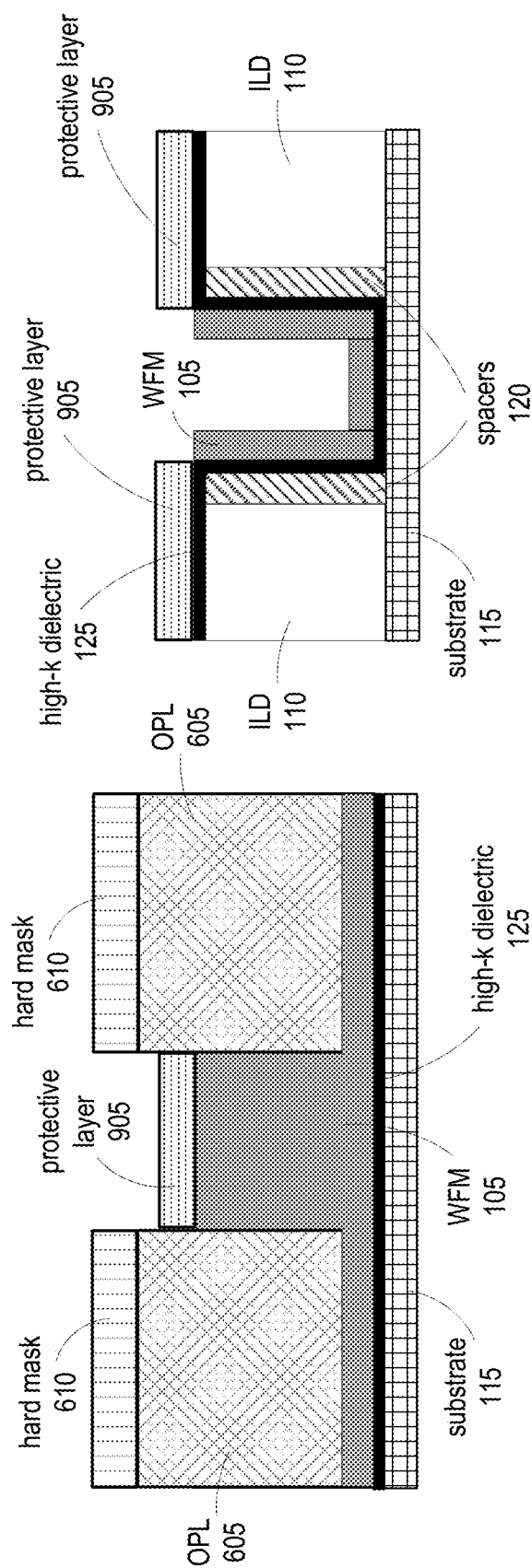
FIG. 9A and FIG. 9B illustrate cross-sectional views of the structure, in which a protective layer (PL) selective to the high-k dielectric, is selectively deposited over the high-k dielectric that covers the top portion of the ILD layer, in accordance with one or more embodiments described herein.

FIGS. 9A and 9B show cross-sectional views of the structure in which a protective layer (PL) 905 is selectively deposited over the high-k dielectric 125 that is situated above the ILD layer 110 and spacers 120. The protective layer can be, for example, an organic material, a polymer, or a dielectric. In 9A, a cross-sectional view along the gate, the protective layer 905 can serve to protect the ILD layer 110 from loss during the removal of the metal liner (e.g., WFM 105). FIG. 9B shows a cross-sectional view, across the gate, showing the selectively deposited protective layer 905 (note in this view, the protective layer 905 is shown, but is not actually deposited on the metal liner, as shown in FIG. 9B). The protective layer is selective to the material used for the high-k dielectric 125, and can be formed onto the high-k dielectric 125 covering the top portion of the ILD layer 110 (and associated spacers 120). Because the protective layer is selective to the high-k dielectric 125, it will not be formed onto the metal liner. As such, with the protective layer to cover the spacers 120 and ILD layer 110, the exposed metal liner (or in other example embodiments as described below, the bulk metal) would be etched, but the ILD layer 110 or the spacers 120 would be preserved (e.g., not etched).

Figure 10:
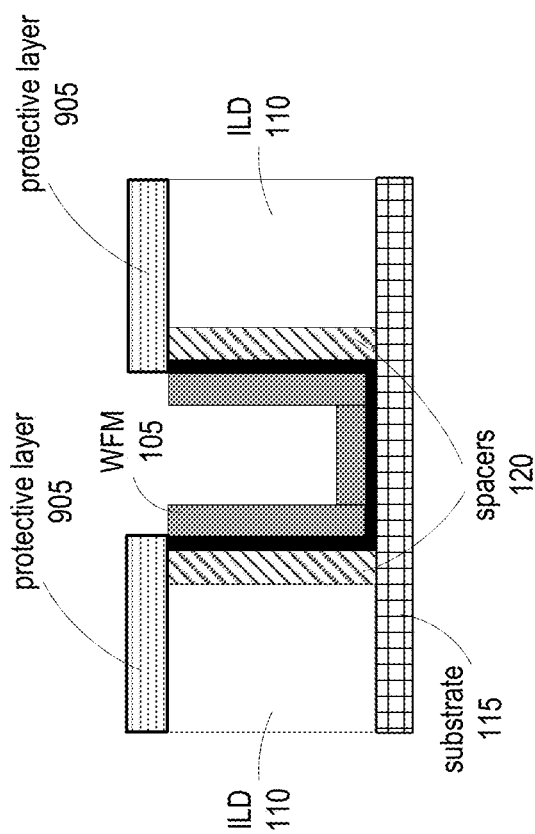
FIG. 10 illustrates a cross-sectional view of the structure, in which the protective layer can be selectively deposited onto the ILD layer itself, in accordance with one or more embodiments described herein.

In other example embodiments, as shown in FIG. 10, which is another cross-sectional view across the gate, the protective layer 905 can be selectively deposited onto the ILD layer 110 itself (e.g., no high-k dielectric is covering the ILD layer 110 and spacers 120) onto the top portion of the ILD layer 110. In example embodiments, as mentioned, the high-k dielectric deposited onto the top portions of the ILD layer 110 and spacers 120 during the formation of the replacement metal gate can be considered an attempt to preserve the ILD layer 110 during etching (e.g., anisotropic metal etching), and can be left on in order to provide additional protection against the etching. The protective layer would not be formed onto the metal liner (e.g., WFM 105), so that when the unprotected metal liner is etched, the ILD layer 110 is preserved.

A variety of selective deposition techniques can be used to deposit the protective layer 905 onto either the high-k dielectric (e.g., FIG. 9A, 9B), or onto the ILD layer 110 (e.g., FIG. 10). In some embodiments, the protective layer can be of a material that can selectively bind only to dielectrics (e.g., selective dielectric deposition), for example the high-k dielectric 125 (e.g., and will not bind to the metal liner, WFM 105). The material can be set to deposit on, for example, silicon oxide (SiO), SiN, silicon boron carbon nitride (SiBCN) desired for gate cut in the replacement metal gate mode. In example embodiments, geometric selective deposition is also possible.

In some embodiments, the selective deposition can include the selective deposition of a self-assembled monolayer (SAM) onto the high-k dielectric 125, or onto the ILD layer 110 itself. As an example, hydroxide (—OH) terminated groups can bind to silicon dioxide (SiO2), providing protective coverage. Phosphonic acid terminated groups can bind to TiO2 and HfO2 based surfaces. The SAM can be resistant to the plasma chemistry used for the etching of the metal liner. The body of the monolayer can have a wide range of resistant functional groups. If aggressive plasma used for the etching also removes the SAM, it can be re-applied, and then the etching can continue. In additional embodiments, the surface of the high-k dielectric 125, or the surface of the ILD layer 110, can be treated to promote selective deposition or grafting of the protective layer 905. The treated surface would enable deposition onto the ILD layer 110 or the high-k dielectric 125, and not onto an untreated surface, which would include the metal liner (WFM 105).

Additionally, in example embodiments, the anisotropic metal etching to remove the metal liner (e.g., WFM 105) can be very aggressive, so several deposition cycles can be employed during the selective deposition process (e.g., a multi-deposition sequence to repeatedly selectively deposit the layer). The thickness of the selectively deposited material, and the type of material used for the selective deposition can be related to (or depend in part on) the metal etch chemistry and plasma bias. Thus, the SAM layer can be deposited in cycles to maintain coverage on the ILD layer 110. In example embodiments, the selective deposition (e.g., of a polymer or other organic material or organic by-product) can occur during the metal liner etching process.

Figures 11A, 11B:
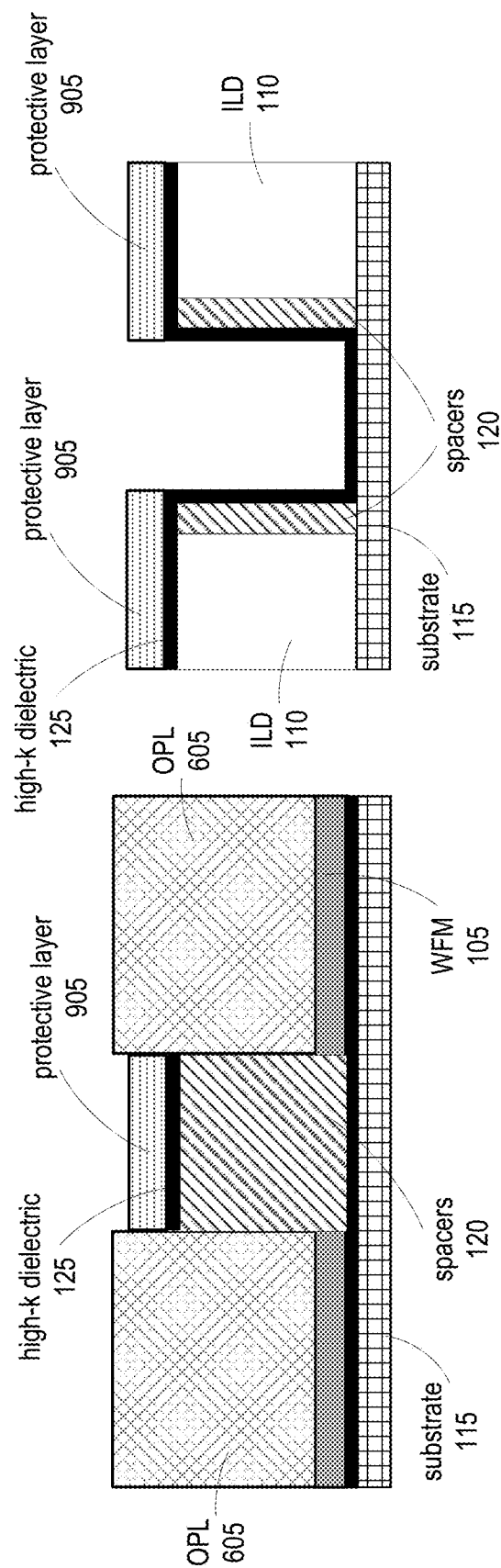
FIG. 11A and FIG. 11B illustrate cross-sectional views of the structure, both along the gate and across the gate, in which the metal liner has been etched away to generate a vertical CT cut, while the protective layer selectively deposited on the high-k dielectric remains, in accordance with one or more embodiments described herein.

FIG. 11A and FIG. 11B show cross-sectional views in which the metal liner (e.g., WFM 105) has been etched away to generate a vertical CT cut, while the protective layer 905 selectively deposited on the high-k dielectric 125 remains. Also protected from the etching process are the ILD layer 110 and spacers 120. The cross-sectional view shown in FIG. 11A is along the gate, showing the spacers 120, as opposed to the trench region which is now void of the metal liner. The hard mask layer 610 can also be removed. As an example, as mentioned above, TiOx can be removed using, for example, a wet chemical etching solution, which can include a mixture of ammonium hydroxide, hydrogen peroxide, and water. This can selectively remove the TiOx. The TiOx can also be removed during the metal liner removal process (e.g., during a reactive ion etch). In example embodiments, as mentioned above, a deposition/etching sequence can be employed if needed, wherein etching of the metal liner occurs, but deposition of the protective layer 905 also occurs. As an example, as the metal liner is etched and the protective layer 905 begins to thin, more of the protective layer 905 can be selectively deposited. The number of cycles can be based upon, for example, the selectivity of the protective layer 905 to prevent any high-k dielectric 125 (e.g., HfO2) from the etch. In other example embodiments, the protective layer 905 can be of a material that can be selectively deposited on the high-k dielectric layer 125 until both the protective layer 905 and the high-k dielectric 125 are consumed during the etch, and then after the loss of those layers, another protective layer, which can be selective to the ILD layer 110, can then be deposited directly on the ILD layer 110, before etching of the metal liner continues.

Figure 12A:
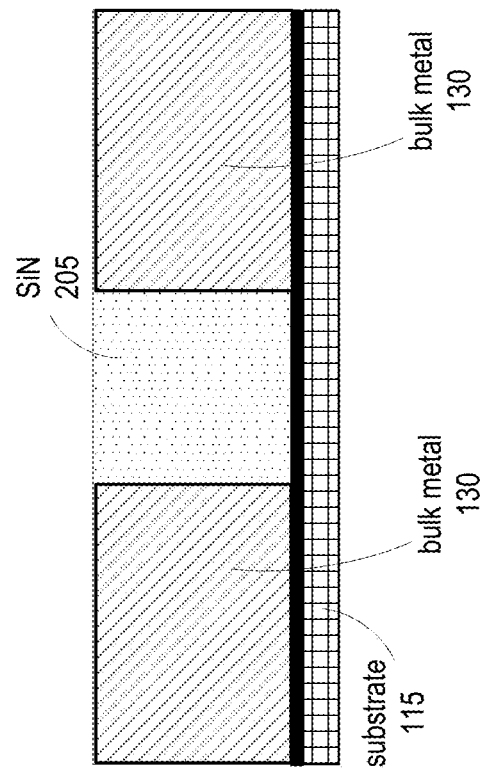
FIG. 12A and FIG. 12B illustrate cross-sectional views of the structure, wherein a CT liner filler has filled the trench region after the metal liner has been removed, in accordance with one or more embodiments described herein.
Figure 12B:
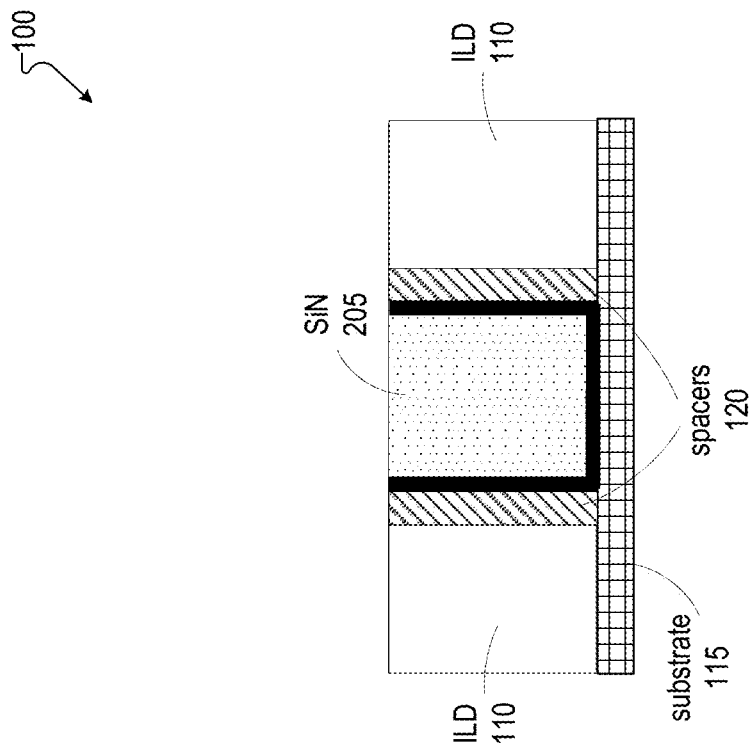

FIGS. 12A and 12B show cross-sectional views of the structure after the protective layer 905 has been removed. Subsequent to the metal liner (e.g., WFM 105) and the hard mask layer 610 having been removed, as described above in FIGS. 11A and 11B above, the protective layer 905, can be removed if any of it still remains after the etching (e.g., metal liner and hard mask removal). The high-k dielectric 125 can optionally remain, if it too has not been eroded away during the etching. As shown in FIG. 12B, the gate region (e.g., the trench region from which the metal liner has been removed) is then filled with a CT liner filler, which can be an insulator material (e.g., SiN 205). A corresponding cross-sectional view along the gate (FIG. 12A) shows the CT liner filler as well.

As shown in the cross-sectional views in FIG. 13A, the OPL can be removed and filled with a bulk metal (e.g., tungsten, cobalt, tungsten titanium nitride, titanium, titanium nitride, tantalum, molybdenum, copper, any combination thereof, and any other bulk metal as well), and, looking at FIG. 13B, any SiN nitride above the ILD layer 110 can be planarized (e.g., using chemical mechanical planarization (CMP)), with the planarization stopping at the top of the ILD layer 110. As mentioned previously, without the protective layer 905, the height/thickness of the ILD layer 110 would have been dramatically reduced, perhaps by as much as 50%. With the preservation of the ILD layer 110, a source-drain interconnect, as shown in FIG. 4 can be created, without significant ILD loss, or SiN preventing the reactive ion etch that creates the source-drain interconnect.

FIGS. 14A-20B describes other example embodiments in which an assembly process involves etching a bulk metal (also referred to herein as a metal filler) and the metal liner (e.g., WFM) from the trench region. Like the assembly described in FIGS. 5A-13B, the process can also employ the use of a hard mask patterning stack (e.g., TiOx), with the hard mask removed in same chemistry as the metal liner during metal etch, and also the selective deposition of a protective layer protecting the ILD layer 110. It is similar to methods described in FIGS. 5A-13B, but in this approach, the metal liner and the bulk metal are both etched.

Figure 14B:
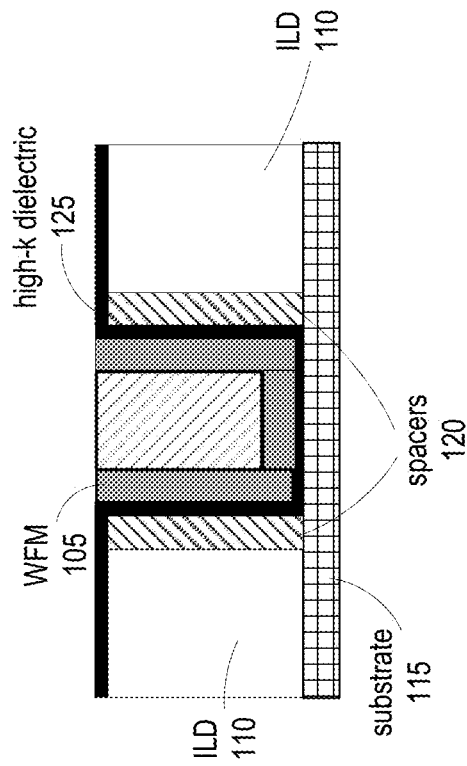
FIG. 14A and FIG. 14B illustrate cross-sectional views of the incoming structure from which the semiconductor product will be patterned and cut, wherein the trench region is filled with both a metal liner (e.g., WFM) and a metallic filler (e.g., bulk metal), in accordance with one or more embodiments described herein.
Figure 14A:
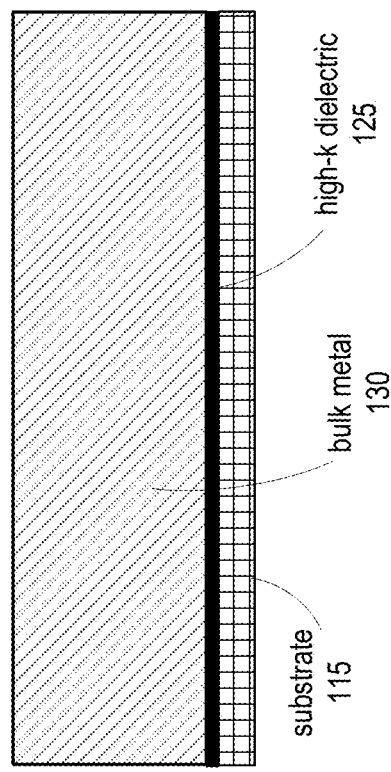

FIGS. 14A and 14B show a cross-section of an incoming structure that is a similar to the incoming structure of FIG. 5A and FIG. 5B, where FIG. 14A shows a cross section along the gate, FIG. 14B shows a cross-section across the gate. Whereas the incoming structure of FIG. 5A and FIG. 5B show a gate region (e.g., trench region) with the metal liner (e.g., WFM), FIGS. 14A and 14B show a gate region filled with both the metal liner (e.g., WFM 105) and a bulk metal 130 (e.g., tungsten), wherein the cross-sectional cut in 14A shows the bulk metal in the gate. Referring to FIG. 14B, a high-k dielectric 125 can be left on the ILD layer 110 to provide some initial protection from etching.

FIGS. 15A and 15B show cross sections of the structure. The sequence is similar to the corresponding sequence in FIGS. 6A and 6B, the sequence comprising OPL 605 deposition, deposit of a hard mask layer 610 (e.g., TiOx) patterning layer, resist layer 615 deposition, and then CT lithography (to open up the regions in the resist layer 615). FIG. 15A provides a cross-sectional view along the gate, showing the cut region filled with the bulk metal 130, the OPL 605 above the bulk metal 130, and the hard mask layer 610 covering the OPL 605. In some example embodiments, an additional hard mask layer (not shown) can be deposited prior to the OPL deposition (not the same hard mask layer 610 used in the patterning stack). The CT pattern can then be etched in the hard mask (after TiOx/OPL etching/pattern transfer) using a memorization etch technique, used for etching the metal subsequently. The resist layer 615 is not shown in FIG. 15B to reflect the cross-sectional view that includes the cut region (CT) being void of resist layer 615.

FIGS. 16A and 16B show cross-sectional views of the structure, wherein CT patterning is used to create an anisotropic profile by etching (e.g., using a reactive ion etch) the hard mask layer 610 and OPL 605. The resist layer 615 can also be removed during the etch of the OPL 605. The cross-sectional view of the structure in FIG. 16B shows a structure similar to that of FIG. 7B, except in this embodiment shown in FIG. 16B, a bulk metal 130 is also in the trench region in addition to the metal liner (e.g., WFM 105). Optionally, in some example embodiments, etching of the CT pattern into the hard mask is also performed.

FIG. 17A and FIG. 17B show cross-sectional views wherein a protective layer (e.g., protective layer 905) can be selectively deposited. FIG. 17A and FIG. 17B are similar to FIG. 9B and FIG. 10, with the primary difference being that a bulk metal 130 resides in the trench region. Referring to FIG. 17A, as was with FIG. 17A, the protective layer 905 can be selectively deposited onto the high-k dielectric 125 that covers the top portion of the ILD layer 110 and the spacers 120. The protective layer is selective to the material used for the high-k dielectric 125, and can be formed onto the high-k dielectric 125 covering the top portion of the ILD layer 110, and formed onto the high-k dielectric 125 covering the top portion of the ILD layer 110 (and associated spacers 120). Because the protective layer is selective to the high-k dielectric 125, it will not be formed onto the metal liner (e.g., WFM 105), or the bulk metal 130. As such, with the protective layer to cover the spacers 120 and ILD layer 110, the exposed metal liner and bulk metal would be etched, but the ILD layer 110 or the spacers 120 would be preserved (e.g., not etched or recessed). The selective deposition techniques mentioned above can also be applied here.

Referring to FIG. 17B, as was with FIG. 10, in the scenario in which there is no high-k dielectric 125 that covers the top portion of the ILD layer 110 and the spacers 120, the protective layer 905 can be selectively deposited onto the top portions of the ILD layer 110 and the spacers 120. That is, the protective layer 905 can be selectively deposited onto the ILD layer 110 itself (e.g., no high-k dielectric is covering the ILD layer 110 and spacers 120), e.g., onto the top portion of the ILD layer 110. The protective layer would not be formed onto the metal liner (e.g., WFM 105) or the metallic filler (bulk metal 130), so that when the unprotective metal liner and metallic filler are etched, the ILD layer 110 is preserved. The selective deposition techniques mentioned above can also be applied here.

Figure 18A:
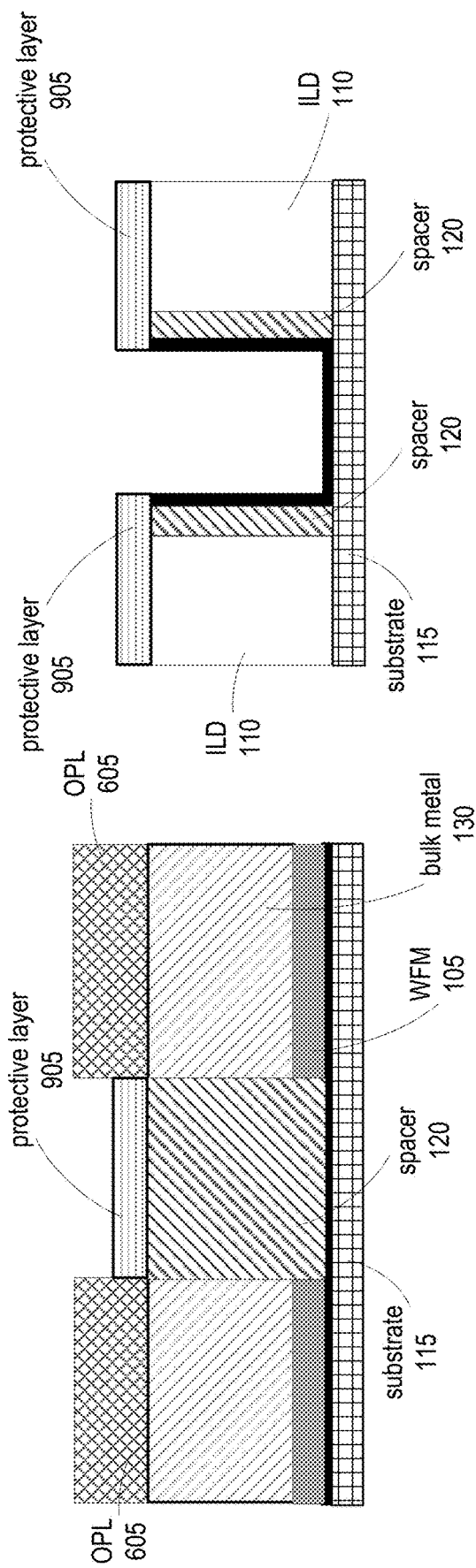

FIGS. 18A and 18B are cross-sectional views illustrating the structure after the bulk metal 130 and metal liner (e.g., WFM 105) have been removed (e.g., via an RIE). The hard mask layer 610 (e.g., TiOx) can also be removed at this stage. Because the protective layer 905 covers the top portion of the spacers 120 and ILD layer 110, as shown in FIGS. 18A and 18B, the spacers 120 and ILD layer 110 are not recessed or etched during the metal etching process. Also, because the protective layer 905 did not cover the metal liner in the gate region, the metal liner and bulk metal 130 are removed during the etch. In other example embodiments, any remaining underlying high-k dielectric 125 that covers the top portions of the ILD LAYER 110 and spacers is also protected by the protective layer 905 during the etch of the metal liner and bulk metal 130.

Figures 19A, 19B:
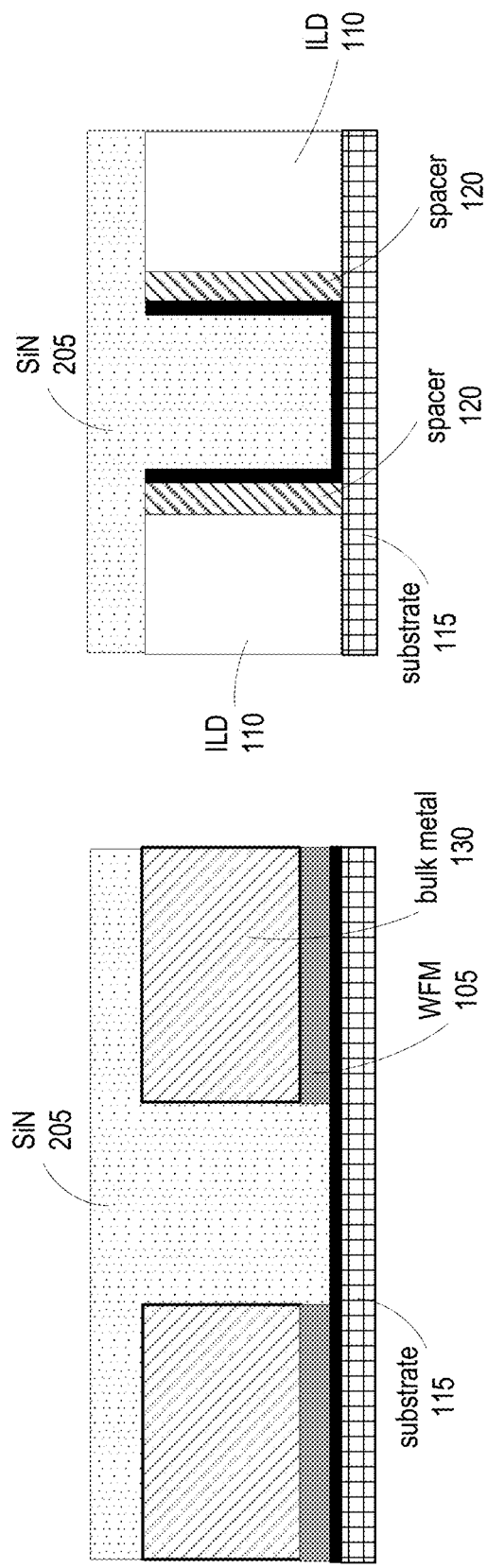
FIG. 19A and FIG. 19B illustrate cross-sectional views of the structure, wherein a CT liner filler (e.g., an insulator material such as SiN) has filled the trench region after the both metallic filler and the metal liner have been removed, in accordance with one or more embodiments described herein.

FIGS. 19A and 19B show cross-sectional views of the structure in which the OPL 605 has been stripped, the protective layer 905 removed, and the gate region filled with an insulator (e.g., SiN 205). In example embodiments, the high-k dielectric 125 can optionally remain, if it too has not been eroded away during the etching, and can be later removed before RIE to create the source drain interconnect. A corresponding cross-sectional view along the gate (FIG. 19A) shows the CT liner filler material as well.

Figures 20A, 20B:
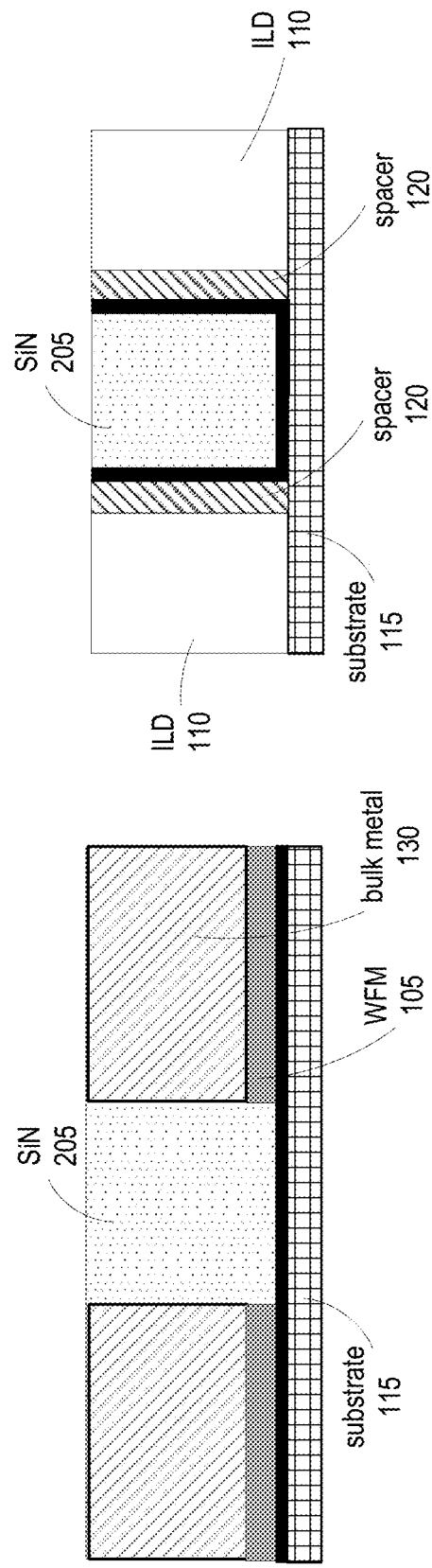
FIG. 20A and FIG. 20B illustrate cross-sectional views of the structure in which the CT liner filler above the ILD layer is planarized, in accordance with one or more embodiments described herein.

FIGS. 20A and 20B show cross-sectional views of the structure in a form that is ready for source-drain contacts to be made. Any SiN nitride above the ILD layer 110 can be planarized (e.g., using chemical mechanical planarization (CMP)), with the planarization stopping at the top of the ILD layer 110. With the preservation of the ILD layer 110, a source-drain interconnect, as shown in FIG. 4 can be created, without significant ILD loss, or SiN preventing the reactive ion etch that creates the source-drain interconnect.

Figure 21:
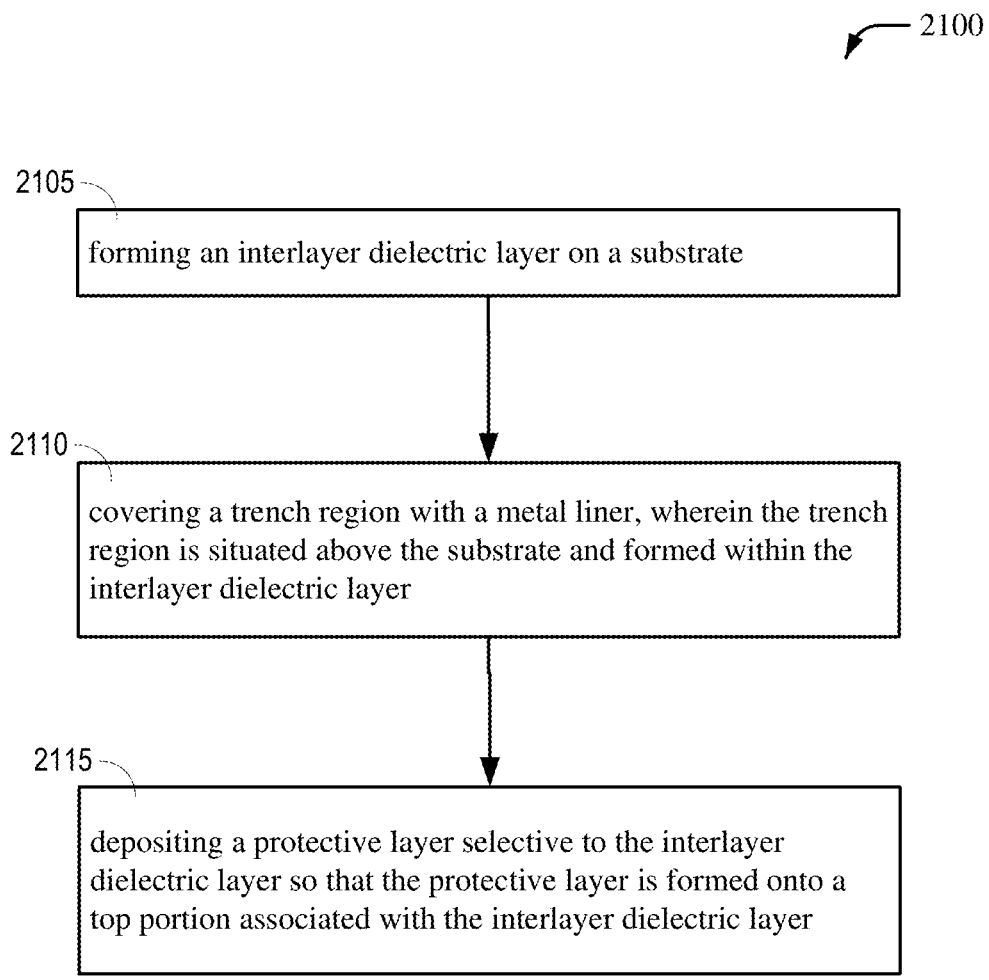
FIG. 21 illustrates a flow diagram of example, non-limiting method that facilitates assembly of a semiconductor structure, including hard mask patterning, the selective deposition of a protective layer protecting the ILD layer, and the removal of a metal liner (and in some embodiments a metal filler and the metal liner) from a trench region, in accordance with one or more embodiments described herein.
Figure 22:
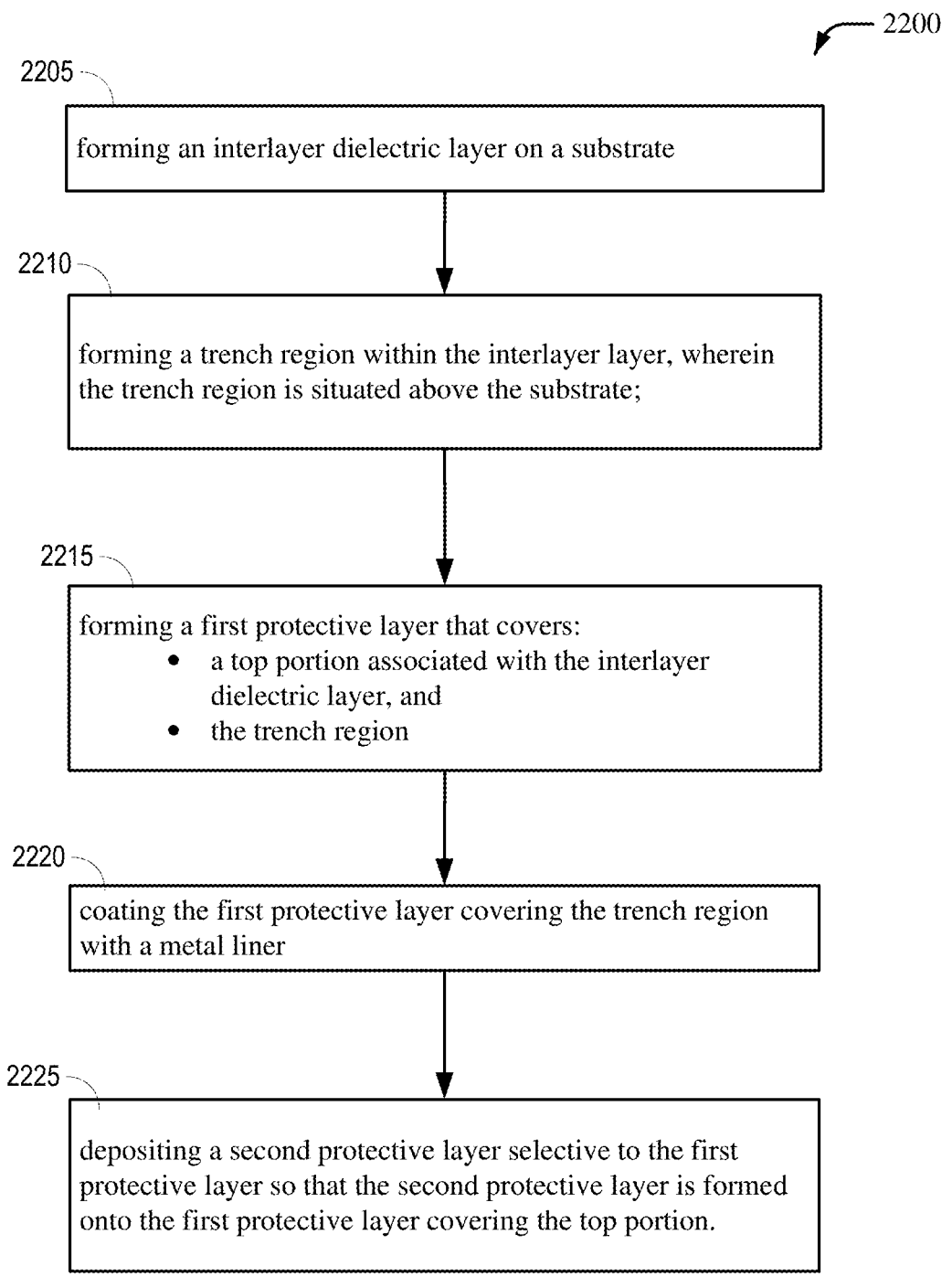
FIG. 22 illustrates a flow diagram of another example, non-limiting method that facilitates assembly of a semiconductor structure, including hard mask patterning, the selective deposition of a protective layer protecting the ILD layer, and the removal of a metal liner (and in some embodiments a metal filler and the metal liner) from a trench region, in accordance with one or more embodiments described herein.

FIGS. 21-22 illustrate a flow diagrams of example, non-limiting methods that facilitates assembly of a semiconductor structure with gates, in accordance with one or more embodiments described herein. In non-limiting example embodiments, a computing device (or system) (e.g., computer 2012) is provided comprising one or more processors and one or more memories that stores executable instructions that, when executed by the one or more processors, can facilitate performance of the operations as described herein, including the non-limiting methods as illustrated in the flow diagrams of FIGS. 21-22. As a non-limiting example, the one or more processors can facilitate performance of the methods by directing or controlling one or more equipment operable to perform semiconductor fabrication.

The method 2100 can, at 2105, comprise forming an interlayer dielectric layer (e.g., ILD layer 110) on a substrate (e.g. substrate 115). The method at 2110 can comprise covering a trench region (e.g., gate region) with a metal liner (e.g., WFM 105), wherein the trench region is situated above the substrate and formed within the interlayer dielectric layer. The method at 2115 can comprise depositing a protective layer (e.g., protective layer 905) selective to the interlayer dielectric layer so that the protective layer is formed onto a top portion associated with the interlayer dielectric layer. The protective layer can comprise an organic material, a polymer, or a dielectric. Any of the methods mentioned above can be used for selectively depositing the protective layer. For example, depositing the protective layer can comprise repeatedly depositing the protective layer via a multi-deposition sequence. Depositing the protective layer can comprise depositing a self-assembled monolayer onto the top portion. In other embodiments, the protective layer can be deposited on a high-k dielectric (e.g., high-k dielectric 125, HfO2) that covers the top portion of the interlayer dielectric layer. The method can further comprise removing the metal liner. The method can further comprise depositing the protective layer during the removing of the metal liner. The method can further comprise removing a metallic filler (e.g., bulk metal 130) occupying a portion of the trench region.

Moving onto the method 2200, at 2205, the method can comprise forming an interlayer dielectric layer (e.g., ILD layer 110) on a substrate (e.g., substrate 115). The method at 2210 can comprise forming a trench region within the interlayer dielectric layer, wherein the trench region is situated above the substrate. The method at 2215 can comprise forming a first protective layer (e.g., a high-k dielectric 125, or a material having a dielectric constant greater than 3.9; e.g., HfO2) that covers: a top portion associated with the first interlayer dielectric layer, and the trench region (e.g., gate region). The method can, at 2220, comprise coating the first protective layer covering the trench region with a metal liner (e.g., WFM 105). At 2225, the method can comprise depositing a second protective layer (e.g., protective layer 905) selective to the first protective layer so that the second protective layer is formed onto the first protective layer (e.g., high-k dielectric) covering the top portion. The depositing the second protective layer can comprise repeatedly depositing the second protective layer via a multi-deposition sequence. The depositing the second protective layer can comprise depositing a self-assembled monolayer onto the first protective layer. The method of can comprising removing the metal liner, and the depositing the second protective layer can occur during the removal of the metal liner. The method can further comprise removing a metallic filler (e.g., bulk metal 130) occupying a portion of the trench region.

Figure 23:
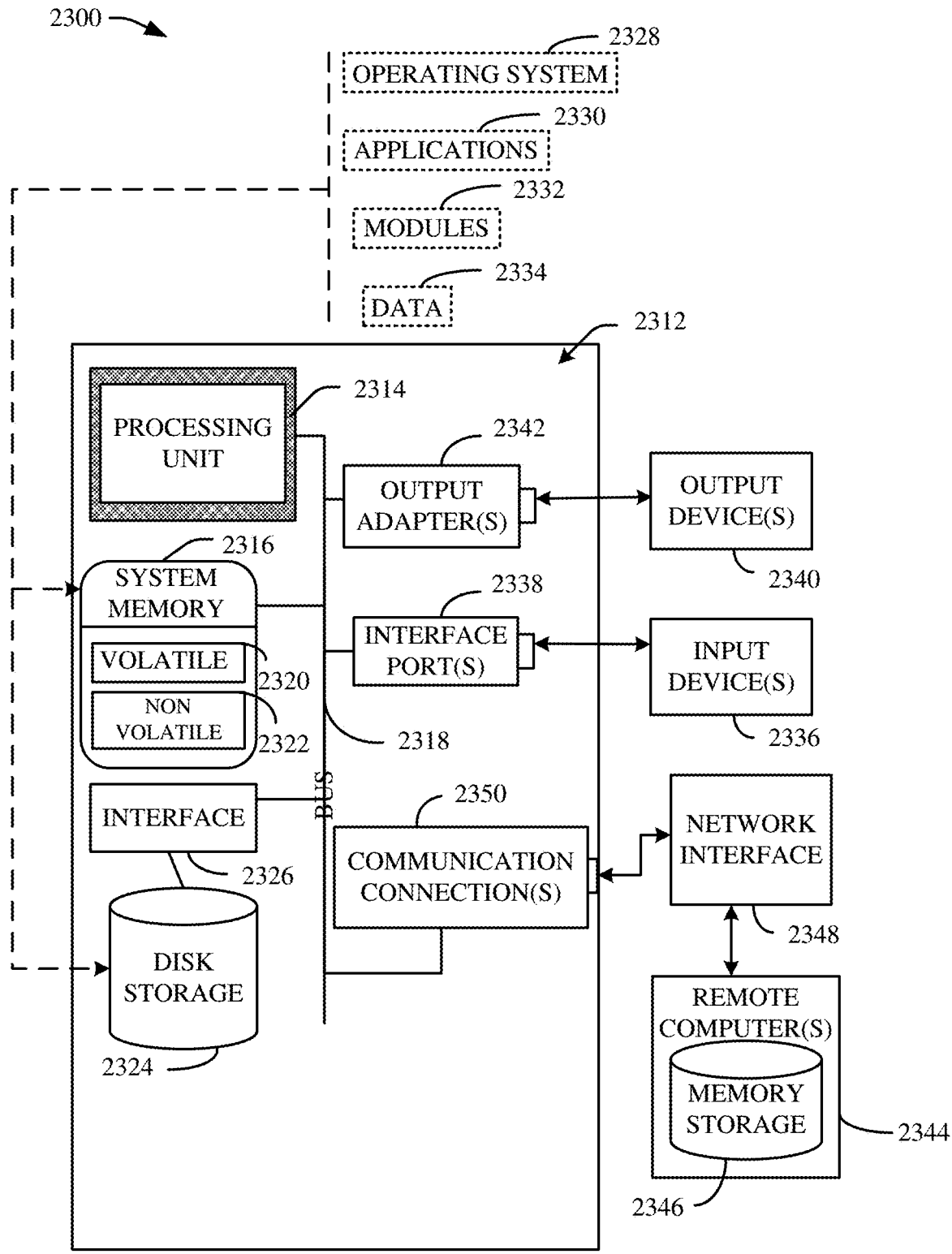
FIG. 23 illustrates a block diagram of an example, non-limiting operating environment in which one or more embodiments described herein can be facilitated.

In order to provide a context for the various aspects of the disclosed subject matter, FIG. 23 as well as the following discussion are intended to provide a general description of a suitable environment in which the various aspects of the disclosed subject matter can be implemented. FIG. 23 illustrates a block diagram of an example, non-limiting operating environment in which one or more embodiments described herein can be facilitated. Repetitive description of like elements employed in other embodiments described herein is omitted for sake of brevity.

With reference to FIG. 23, a suitable operating environment 2300 for implementing various aspects of this disclosure can also include a computer 2312. The computer 2312 can also include a processing unit 2314, a system memory 2316, and a system bus 2318. The system bus 2318 couples system components including, but not limited to, the system memory 2316 to the processing unit 2314. The processing unit 2314 can be any of various available processors. Dual microprocessors and other multiprocessor architectures also can be employed as the processing unit 2314. The system bus 2318 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 2316 can also include volatile memory 2320 and nonvolatile memory 2322. The basic input/output system (BIOS), containing the basic routines to transfer information between elements within the computer 2312, such as during start-up, is stored in nonvolatile memory 2322. Computer 2312 can also include removable/non-removable, volatile/non-volatile computer storage media. FIG. 23 illustrates, for example, a disk storage 2324. Disk storage 2324 can also include, but is not limited to, devices like a magnetic disk drive, floppy disk drive, tape drive, Jaz drive, Zip drive, LS-100 drive, flash memory card, or memory stick. The disk storage 2324 also can include storage media separately or in combination with other storage media. To facilitate connection of the disk storage 2324 to the system bus 2318, a removable or non-removable interface is typically used, such as interface 2326. FIG. 23 also depicts software that acts as an intermediary between users and the basic computer resources described in the suitable operating environment 2300. Such software can also include, for example, an operating system 2328. Operating system 2328, which can be stored on disk storage 2324, acts to control and allocate resources of the computer 2312.

System applications 2330 take advantage of the management of resources by operating system 2328 through program modules 2332 and program data 2334, e.g., stored either in system memory 2316 or on disk storage 2324. It is to be appreciated that this disclosure can be implemented with various operating systems or combinations of operating systems. A user enters commands or information into the computer 2312 through input device(s) 2336. Input devices 2336 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 2314 through the system bus 2318 via interface port(s) 2338. Interface port(s) 2338 include, for example, a serial port, a parallel port, a game port, and a universal serial bus (USB). Output device(s) 2340 use some of the same type of ports as input device(s) 2336. Thus, for example, a USB port can be used to provide input to computer 2312, and to output information from computer 2312 to an output device 2340. Output adapter 2342 is provided to illustrate that there are some output devices 2340 like monitors, speakers, and printers, among other output devices 2340, which require special adapters. The output adapters 2342 include, by way of illustration and not limitation, video and sound cards that provide a means of connection between the output device 2340 and the system bus 2318. It should be noted that other devices and/or systems of devices provide both input and output capabilities such as remote computer(s) 2344.

Computer 2312 can operate in a networked environment using logical connections to one or more remote computers, such as remote computer(s) 2344. The remote computer(s) 2344 can be a computer, a server, a router, a network PC, a workstation, a microprocessor based appliance, a peer device or other common network node and the like, and typically can also include many or all of the elements described relative to computer 2312. For purposes of brevity, only a memory storage device 2346 is illustrated with remote computer(s) 2344. Remote computer(s) 2344 is logically connected to computer 2312 through a network interface 2348 and then physically connected via communication connection 2350. Network interface 2348 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 2350 refers to the hardware/ software employed to connect the network interface 2348 to the system bus 2318. While communication connection 2350 is shown for illustrative clarity inside computer 2312, it can also be external to computer 2312. The hardware/ software for connection to the network interface 2348 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The description of the various embodiments of the present invention have been presented for purpose of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

Further, what has been described above include mere examples of devices and methods. It is, of course, not possible to describe every conceivable combination of components or methods for purposes of describing this disclosure, but one of ordinary skill in the art can recognize that many further combinations and permutations of this disclosure are possible. Furthermore, to the extent that the terms "include," "have," "possess," and the like are used in the detailed description, claims, appendices and drawings such terms are intended to be inclusive in a manner similar to the term "comprising" as "comprising" is interpreted when employed as a transitional word in a claim.

What is claimed is:

1. A system, comprising:
    an interlayer dielectric layer formed on a substrate;
    a trench region formed within the interlayer dielectric layer situated above the substrate;
    a dielectric layer that provides a first lining within and over each side of the trench region;
    a metal liner providing a second lining within and over each side of the trench region, wherein the metal liner coats the surface of the dielectric layer on each side of the trench region, wherein the first lining is distinct in material from the second lining; and a protective layer resistant to anisotropic metal etching and selective to the interlayer dielectric layer so that the protective layer directly contacts, due to selectivity of the protective layer, the top portion associated with the interlayer dielectric layer and a top portion of a spacer, and wherein the protective layer does not directly contact, due to selectivity of the protective layer, the metal liner.

2. The system of claim 1, wherein the protective layer comprises an organic material.

3. The system of claim 1, wherein the protective layer comprises a polymer.

4. The system of claim 1, wherein the protective layer comprises a self-assembled monolayer.

5. The system of claim 1, wherein the protective layer is formed via a multi-deposition sequence.

6. The system of claim 1, further comprising spacers, wherein each of the spacers is disposed between the first lining and the interlayer dielectric layer.

7. The system of claim 6, further comprising bulk metal inside the metal liner and filling the trench region.

\* \* \* \* \*